(12) United States Patent
Boudoux et al.

(10) Patent No.: US 12,736,565 B2
(45) Date of Patent: Sep. 15, 2026

(54) CURRENT MEASUREMENT CIRCUIT AND METHOD

(71) Applicant: Aptiv Technologies AG, Schaffhausen (CH)

(72) Inventors: Emmanuel Boudoux, Cologne (DE); Krzysztof Tokarz, Łapczyca (PL)

(73) Assignee: Aptiv Technologies AG, Schaffhausen (CH)

( * ) Notice: Subject to any disclaimer, the term of this patent is extended or adjusted under 35 U.S.C. 154(b) by 159 days.

(21) Appl. No.: 18/736,814

(22) Filed: Jun. 7, 2024

(65) Prior Publication Data

US 2024/0426878 A1 Dec. 26, 2024

(30) Foreign Application Priority Data

Jun. 22, 2023 (EP) .................................... 23181069

(51) Int. Cl.
*G01R 19/165* (2006.01)
*G01R 19/00* (2006.01)
*H03G 1/00* (2006.01)

(52) U.S. Cl.
CPC ....... *G01R 19/165* (2013.01); *G01R 19/0023* (2013.01); *H03G 1/0088* (2013.01)

(58) Field of Classification Search
CPC .... G01R 19/165; G01R 19/10; G01R 19/155; G01R 19/0023; H03G 1/0088
USPC ..................................... 324/127, 123, 123 R
See application file for complete search history.

(56) References Cited

U.S. PATENT DOCUMENTS 7,683,604 B1 3/2010 Steele
2005/0270198 A1* 12/2005 Hehn ................ G01R 19/0092 341/120
2013/0214804 A1* 8/2013 Dietz .................... G01R 1/203 324/713
2015/0137820 A1* 5/2015 Mikuteit ............ G01R 31/3644 324/426
2022/0268811 A1* 8/2022 Nakagaki .............. F04D 27/004

* cited by examiner

*Primary Examiner* — Lee E Rodak
*Assistant Examiner* — Taqi R Nasir
(74) *Attorney, Agent, or Firm* — Miller Johnson

(57) ABSTRACT

A current measurement circuit includes an operational amplifier, an input connector, a gain control sub-circuit, and a measurement output. The operational amplifier includes two inputs and an output. The input connector is for connecting the two inputs across a current-sense resistor. The gain control sub-circuit is connected to the output and includes a switch operable to select a current path from a plurality of current paths. The measurement output is connected to the gain control sub-circuit for outputting a signal indicating a measured current based on a selected current path. The gain control sub-circuit is configured to select a gain across the operational amplifier based on a ratio between the input connector and the selected current path.

12 Claims, 3 Drawing Sheets

1
21
10
11
2
4
3
5
6
51
54
53
52

1
21
10
2
11
4
3
5
61
54
53
51
62
52

1
21
10
2
4
11
3
5
61
54
55
53
51
56
62
52

1
21
10
4
11
2
3
5
55
57
VDD
VDD
58
53
61
56
51
59
581
62
54
52

CURRENT MEASUREMENT CIRCUIT AND METHOD

CROSS-REFERENCE TO RELATED APPLICATIONS

This application claims priority to EP 23 181 069 filed Jun. 22, 2023, the entire disclosure of which is incorporated by reference.

FIELD

The present disclosure relates to a current measurement circuit and method for controlling a current measurement device. The present disclosure is particularly relevant to a switchable gain amplifier with saturation protection, and current protection devices and load drivers incorporating the same.

BACKGROUND

In modern vehicles, it is common to have several loads that consume very high currents. For example, a vehicle's electric power steering (EPS) system may draw up to 80-100 amps in high demand scenarios, such as in urban driving scenarios. In contrast, when the vehicle is travelling at higher speeds in motorway scenarios, the current drawn by the EPS is low because the steering actions are relatively minimal. As vehicles incorporate more automation systems, the range of current demand on load driver circuits continues to increase. For example, a load driver circuit may need to supply current in the range of 1 amp to 800 amps.

The above current ranges present a particular challenge for the current monitoring circuits associated with load drivers. That is, it is typically necessary to incorporate a shunt or current-sense resistor as a current measurement sensor to monitor operation and detect faults in vehicle systems. For example, the current monitoring circuit may be used to trigger an electronic fuse, and hence it is necessary to correctly measure the current to provide for the detection of a potential overcurrent or short-circuit. However, in load drivers capable of supporting very high current, it is necessary to moderate the gain of the current sensor to avoid measurement saturation. However, this reduces the measurement resolution at lower currents.

In load drivers capable of delivering very high currents often use a double driver to avoid exceeding the technical limitations of the MOSFET. In such cases, one configuration to address the above issue is to incorporate dual current measurement, with the outputs of both measurements being combined to measure the overall current. However, although this allows for a lower gain to be achieved on each channel improving overall measurement resolution, component costs are increased as a current amplifier is needed for each channel. Furthermore, the combined measurement requires a microcontroller with several input pins, which adds to the expense and complexity.

Accordingly, there is a need to address the above issues and provide a current measurement circuit having a good measurement resolution for low currents, whilst still being able to monitor for over currents and minimising component costs.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to a first arrangement, there is provided a current measurement circuit comprising: an operational amplifier comprising two inputs and an output; an input connector for connecting the two inputs across a current-sense resistor; a gain control sub-circuit connected to the output, wherein the gain control circuit comprises a switch operable to select a current path from a plurality of current paths; and a measurement output connected to the gain control sub-circuit for outputting a signal indicating the measured current based on the selected current path, the gain control sub-circuit is configured to select the gain across the operational amplifier based on the ratio between the input connector and the selected current path.

In this way, a switchable gain amplifier may be provided which allows for saturation protection by selectively varying its gain. As such, high resolution current measurements may be achieved at low current levels by selecting a higher gain configuration, while higher currents can be accommodated without saturation of the signal by selecting a lower gain configuration.

In some forms, the gain control circuit comprises a plurality of output resistors and the plurality of current paths connect through one or more of the plurality of output resistors.

In some forms, the gain control sub-circuit comprises a high gain current path and a low gain current path, wherein the low gain current path has lower resistance than the high gain current path, and wherein the switch is operable to selectively connect the output to one of the high and low gain current paths.

In some forms, the current measurement circuit further comprises a controller for controlling the switch based on characteristics indicative of the sensed current amplitude. In this way, the controller may automatically vary the gain of the measurement circuit to optimise the resolution against the risk of measurement saturation.

In some forms, the controller controls the switch based on the characteristics exceeding a threshold, and wherein the threshold is selected to be indicative of a current amplitude below a saturation amplitude associated with the operational amplifier. In this way, the risk of measurement saturation may be avoided by selecting a threshold lower than a current amplitude level at which the measurements will saturate.

In some forms, the characteristics comprise the voltage.

In some forms, the voltage on the output is measured relative to ground.

In some forms, the controller comprises a comparator for comparing a voltage on the measurement output to a threshold. In this way, a rapid response may be provided by the controller.

In some forms, the controller further comprises a voltage follower connected between the measurement output and the comparator for generating an input signal to the comparator based on a voltage on the measurement output. In this way, the voltage follower may function as an input buffer to avoid influence of the comparator on the measured signal.

In some forms, the measurement output comprises a high gain measurement output and a low gain measurement output, and wherein the switch is operable to select a current path for providing a lower gain signal on the low gain measurement output and a current path for providing a higher gain signal on the high gain measurement output.

In some forms, the gain control sub-circuit comprises first and second output resistors connected in series between the output and ground, and the switch is operable to bypass the first output resistor, and wherein the high gain measurement output is connected to ground through the first and second output resistors and the low gain measurement output is connected to ground through the second output resistor.

According to a second arrangement, there is provided a load driver comprising the current measurement circuit according to any of the above.

According to a third arrangement, there is provided a current protection device comprising the current measurement circuit to any of the above.

According to a fourth arrangement, there is provided a method of controlling the current measurement circuit according to any of the above, comprising: identifying characteristics exceeding a threshold, wherein the threshold is selected to be indicative of a current amplitude below a saturation amplitude associated with the operational amplifier; controlling the switch to select a current path for reducing the gain across the operational amplifier.

In embodiments, the controller further comprises a hysteresis for preventing oscillations of the comparator output. As such, the threshold may be complemented by a hysteresis, such as a feedback resistor from the output to the positive input below the comparator. This may thereby avoid oscillations of the output of the comparator in which there is successive quick tuning-on and -off of the switch when there is a low amplitude oscillation of the measured current around the threshold value.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figures 1, 2:
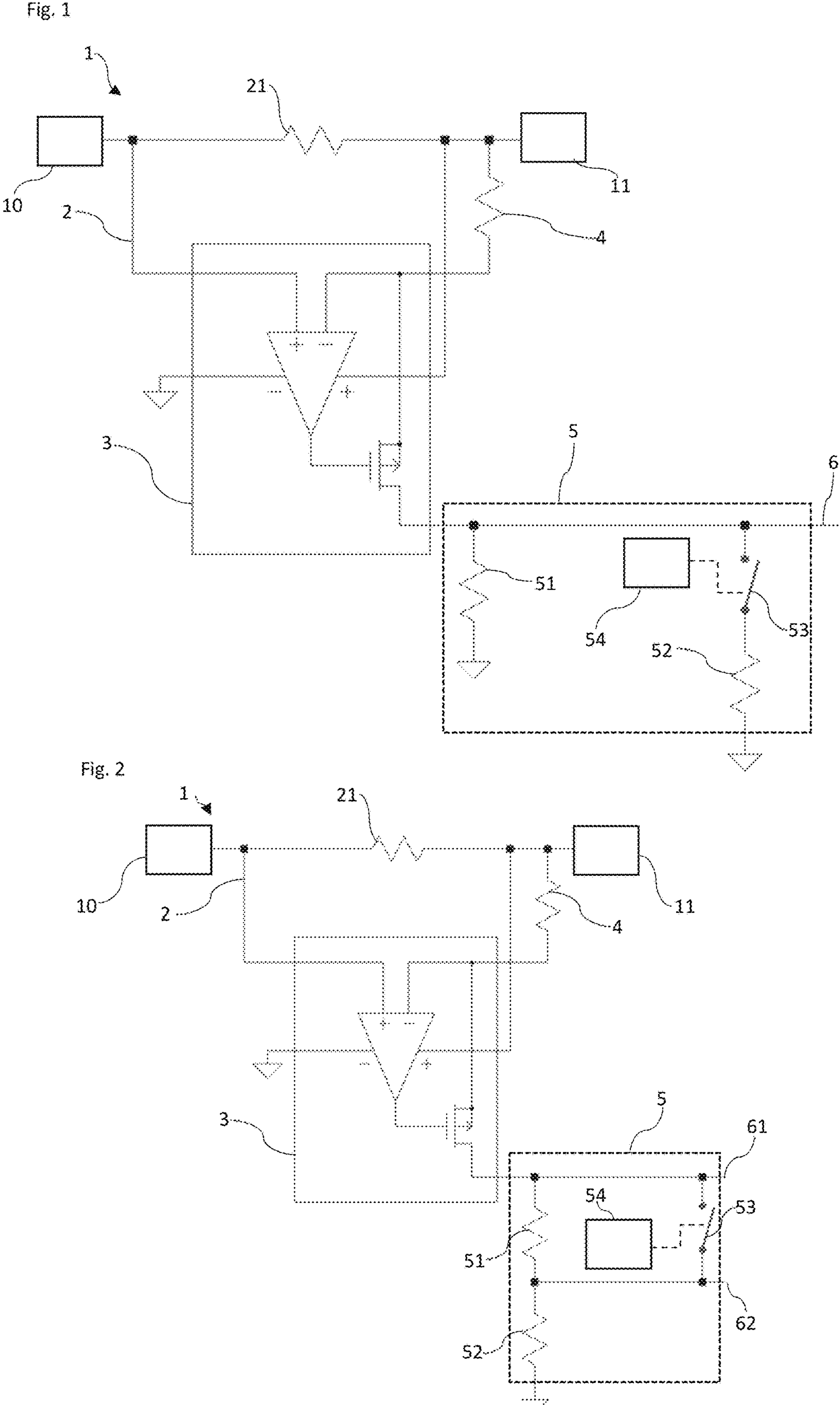
FIG. 1 shows a current measurement circuit according to a first example arrangement.
FIG. 2 shows a current measurement circuit according to a second example arrangement.

FIG. 1 shows a current measurement circuit 1 according to a first example arrangement. The circuit 1 comprises a shunt resistor 21 connected on the line between a power supply 11, such as a battery, and a load 10. A bypass 2 is connected around the shunt resistor 21 and functions as an input for connecting to an operational amplifier (op-amp) 3 in a differential amplifier configuration. An input resistor 4 is connected on the line to the inverting input of the op-amp 3.

A gain control sub-circuit 5 is connected to the output line 6 from the op-amp 3. The gain control circuit 5 comprises a first output resistor 51 connecting between the output line 9 and ground, and a parallel second output resistor 52 switchably connecting between the output line 6 and ground. The second output resistor 52 is switchably connected under the control of switch 53. As such, the operation of switch 53 controls the gain of the current sense circuit based on varying the resistance of the gain control sub-circuit 5.

In this connection, switch 53 may be implemented as a MOSFET controllable to adjust the gain of the current measurement circuit 1 based on the combination of gain setting resistors used. That is, the overall gain is equal to the resistance provided by the gain control sub-circuit 5 divided by the resistance provided by the input resistor 4. As such, when switch 53 is closed, the second output resistor 52 is connected, lowering the resistance of the gain control sub-circuit 5. As such, the gain is reduced. This allows higher currents to be measured without saturation. Conversely, when switch 53 is open, thereby disconnecting the second output resistor 52, the output resistance is increased, providing an increased gain. This allows lower currents to be measured with a higher resolution.

The switch 53 is controlled by a controller 54. The controller 54 may be implemented using, for example, a microcontroller or a comparator which provides a signal for controlling the switch 53 such that the switch 53 is open when the voltage being measured exceeds a threshold and closed when the voltage being measured is below the threshold. Accordingly, at higher currents, where a voltage exceeds a predetermined threshold, the gain control sub-circuit 5 is set to a lower gain to avoid saturation. Conversely, at lower currents, where the voltage is below the predetermined threshold, the gain control sub-circuit 5 is set to a higher gain for improved resolution.

FIG. 2 shows a current measurement circuit 1 according to a second example arrangement. This arrangement is similar to the first example, except that gain control sub-circuit 5 comprises the first and second output resistors 51 and 52 connected in series between the output line of the op-amp 3 and ground, with the output line 6 being divided into a high-gain measurement output line 61 and low-gain measurement output line 62. Again, the operation of switch 53 is used to control the gain of the current sense circuit 1 based on varying the resistance of the gain control sub-circuit 5.

In this connection, with the switch 53 open, the output resistance of the gain control sub-circuit 5 is the sum of the first and second output resistors 51, 52, resulting in a high-gain output on high-gain measurement output line 61. As such, the high-gain measurement output line 61 provides a high gain output which can be used for measuring low currents. However, as the current increases, saturation will occur. To address this, switch 53 may be closed to thereby bypass the first output resistor 51. As such, the gain is based on the resistance of the second output resistor 52 divided by the input resistor 4, resulting in a low-gain output being applied on low-gain measurement output line 62. Accordingly, the closing of switch 53 acts to disable the high gain, low current measurement chain outputted on high-gain measurement output line 61.

The switch 53 in this second example is similarly controlled by a controller 54, as with the first example. Accordingly, when the voltage being measured is below a threshold, the switch 53 is closed, providing for a higher gain. Conversely, when the voltage exceeds a predetermined threshold, the switch 53 is opened, providing for a lower gain, for thereby avoiding saturation.

Figure 3:
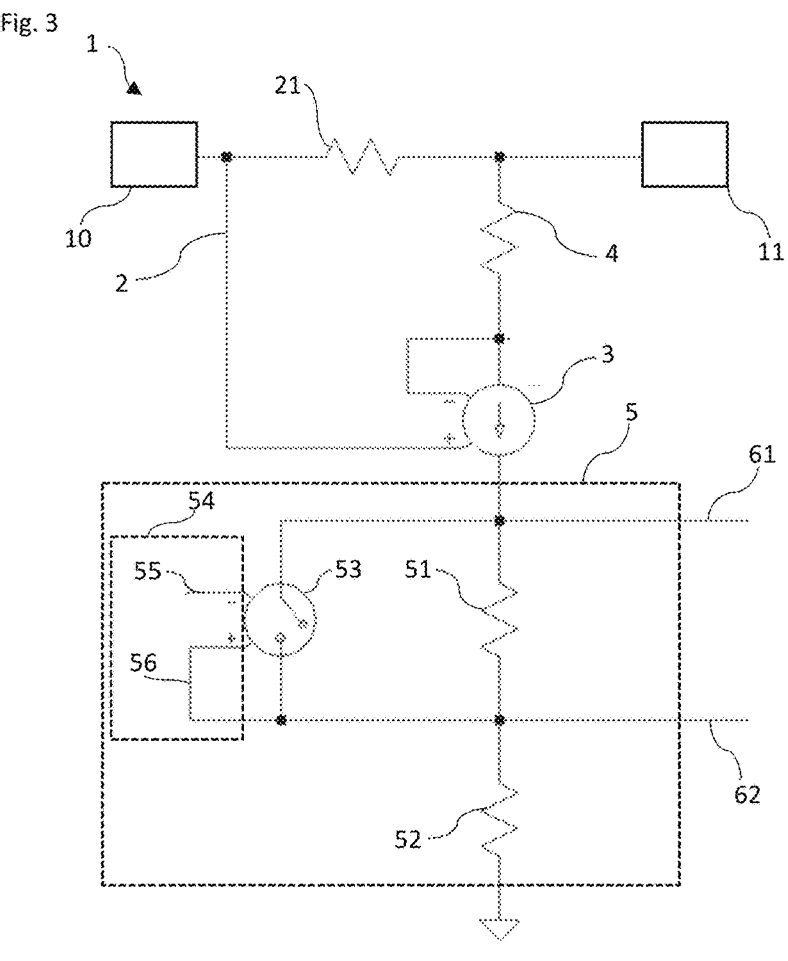
FIG. 3 shows an alternative representation of the current measurement circuit 1 shown in FIG. 2.

FIG. 3 shows an alternative representation of the current measurement circuit 1 shown in FIG. 2, with corresponding features numbered the same. In this case, the controller 54 operates by comparing a threshold voltage input 55 to controller input 56 taken from the low-gain measurement output line 62. As such, when the voltage on the controller input 56 exceeds the threshold voltage applied to threshold voltage input 55, the switch 53 is opened to provide for a lower gain in the current measurement circuit. The low-gain measurement output line 62 is used for the voltage measurement because this is used for high current measurements and the gain on this line is stable and hence is not affected by gain changes implemented using switch 53.

Figure 4:
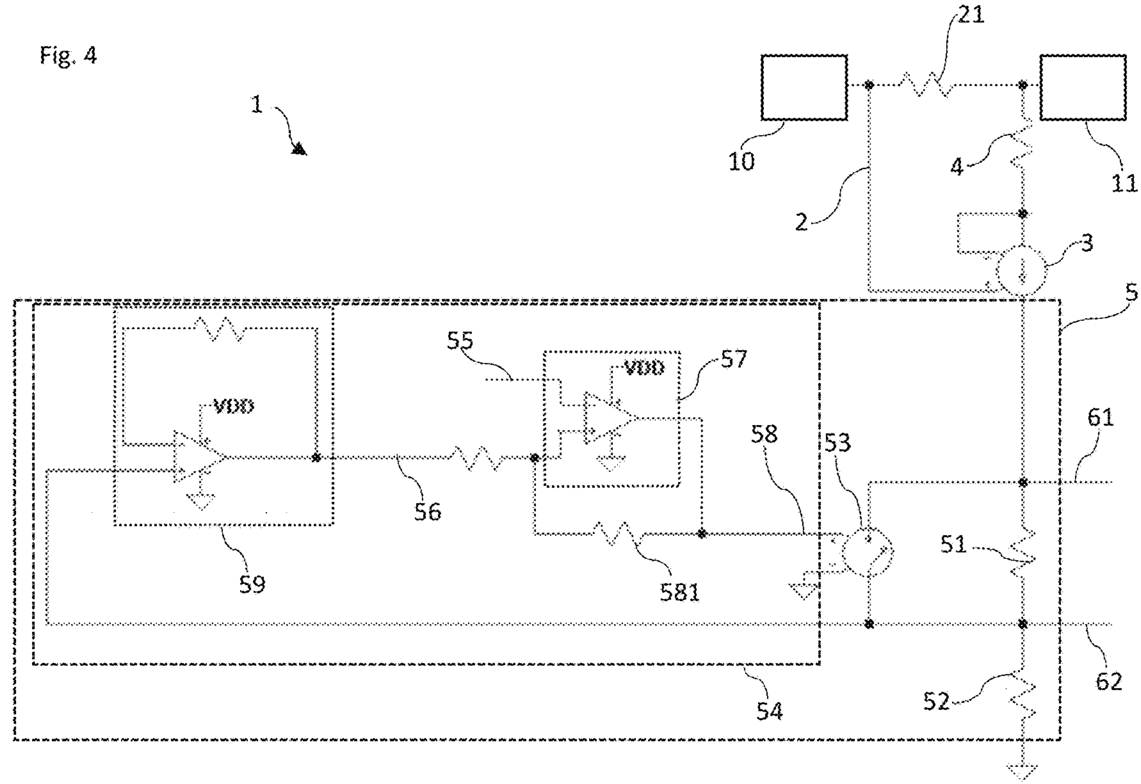
FIG. 4 shows a current measurement circuit according to a fourth example arrangement.

FIG. 4 shows a current measurement circuit 1 according to a third example arrangement. This arrangement is similar to the circuit shown in FIG. 3, except that the controller 54 is shown in further detail. In this case, the signal applied to switch input 58 is controlled by a comparator 57, which includes an op-amp with positive feedback for comparing the voltage on input line 56 with a voltage on threshold voltage input 55. The input line 56 is connected to a voltage follower 58 which simply follows the voltage on the low-gain measurement output line 62, but acts to prevent the comparator 57 from disturbing the signal on the low-gain measurement output line 62. In particular, the provision of a voltage follower 58 may act to mitigate the influence of temperature changes on the switching threshold of the controller 54.

In addition, the controller 54 in this arrangement also incorporates a hysteresis around the comparison threshold to avoid oscillations. That is, the threshold set by the input 55 of comparator 57 is complemented by a feedback resistor 581 from the output 58 to the positive input below comparator 57. This thereby provides a hysteresis which acts to avoid oscillations of the output 58 of the comparator 57 and thereby avoids the successive quick tuning-on and -off of the switch 53 in scenarios where there is a low amplitude oscillation of the measured current around the threshold value.

Accordingly, with the above arrangement, the comparator 57 generates a switch command signal on the switch input 58 when the voltage exceeds a predetermined threshold in order to open the switch 53 for providing a lower gain. As such, saturation of the measurement signal may be avoided.

Figure 5:
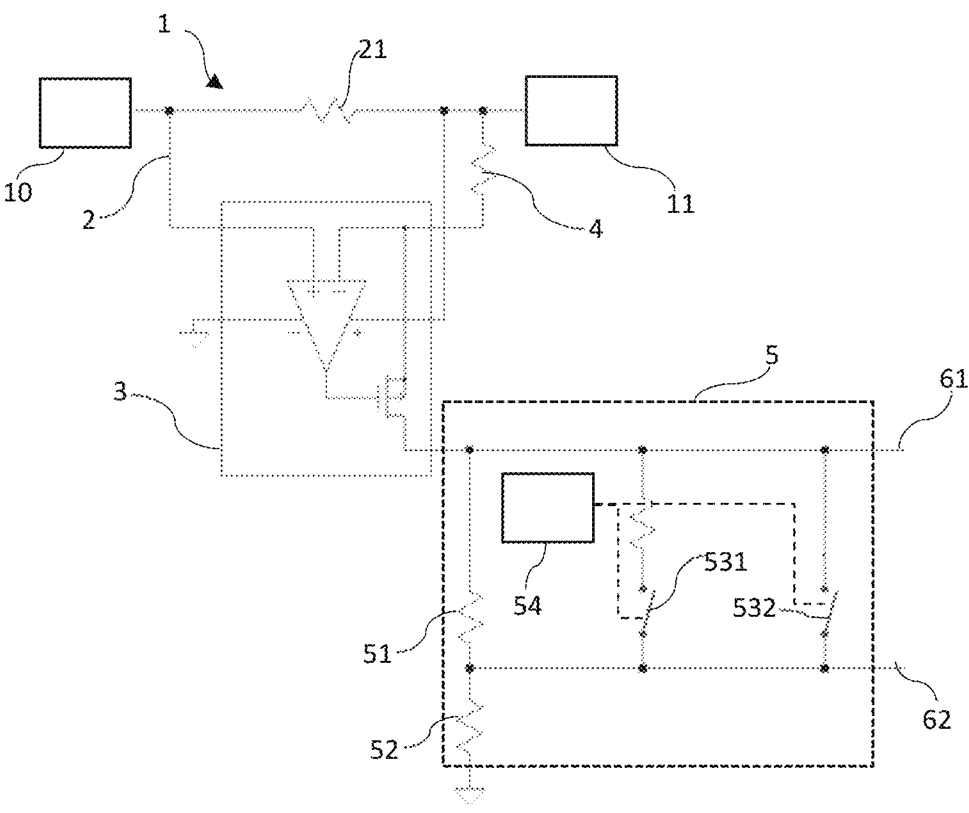
FIG. 5 shows a current measurement circuit according to a fifth example arrangement.

It will be understood that current measurement circuits may be implemented to provide more than two gains. In this respect, FIG. 5 shows a current measurement circuit 1 according to a fourth example arrangement. In this case, the gain control sub-circuit 5 comprises two gain control switches 531, 532 which are independently controlled by controller 54 in order to vary the output resistance. This provides additional gain levels which can be used to vary the amplification of the current measurement circuit.

Accordingly, with the above arrangements, a variable gain current measurement amplifier may be provided which allows for current to be accurately measured over a wide range of amplitudes. In particular, saturation of the measurement amplifier can be avoided at high currents, whilst still providing for high resolution at lower currents.

It will be understood that the embodiments illustrated above show applications only for the purposes of illustration. In practice, embodiments may be applied to many different configurations, the detail of which being straightforward for those skilled in the art to implement.

For example, a microcontroller may be used to monitor the measurement chain and control the switching of the gain control sub-circuit. However, the measurement circuit can go into saturation between two polling periods of the microcontroller if the current varies abruptly. As such, controlling the gain change using a comparator allows rapid gain switching based on logic functions.

It will also be understood that in some arrangements, the low gain (high current) measurement line may be monitored continually, by providing a dedicated low-gain measurement output line 62 with the two output resistors in series.

Finally, it will be understood that various arrangements may be implemented to incorporate the hysteresis principle described above in relation to FIG. 4. As such, the controller may be reinforced using a hysteresis around the comparison threshold in order to avoid oscillations. In arrangements, this hysteresis may be implemented on an analogue comparator with a feedback of the output to the positive input, or digitally in a microcontroller by adjusting the threshold accordingly once a crossing of the initial threshold has been detected.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The term "set" generally means a grouping of one or more elements. The elements of a set do not necessarily need to have any characteristics in common or otherwise belong together. The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. A current measurement circuit comprising:

an operational amplifier including two inputs and an output;

an input connector for connecting the two inputs across a current-sense resistor;

a gain control sub-circuit connected to the output and including a switch operable to select a current path from a plurality of current paths; and a measurement output connected to the gain control sub-circuit for outputting a signal indicating a measured current based on a selected current path, wherein:

the gain control sub-circuit is configured to select a gain across the operational amplifier, the measurement output includes a high-gain measurement output and a low-gain measurement output, the gain control sub-circuit includes a first output resistor and a second output resistor connected in series between the output and ground, the switch is operable to select a low-gain current path for providing a lower-gain signal on the low-gain measurement output by bypassing the first output resistor and connecting to ground through the second output resistor, and the switch is operable to select a high-gain current path for providing a higher-gain signal on the high-gain measurement output by connecting to ground through the first output resistor and the second output resistor.

2. The current measurement circuit of claim 1 wherein the input connector includes an input resistor.

3. The current measurement circuit of claim 1 further comprising a controller for controlling the switch based on characteristics indicative of a sensed current amplitude.

4. The current measurement circuit of claim 3 wherein:

the controller controls the switch based on the characteristics exceeding a threshold; and the threshold is selected to be indicative of a current amplitude below a saturation amplitude associated with the operational amplifier.

5. The current measurement circuit of claim 3 wherein the characteristics include a voltage.

6. The current measurement circuit of claim 5 wherein the voltage on the output is measured relative to ground.

7. The current measurement circuit of claim 3 wherein the controller includes a comparator for comparing a voltage on the measurement output to a threshold.

8. The current measurement circuit of claim 7 wherein the controller includes a voltage follower connected between the measurement output and the comparator for generating an input signal to the comparator based on a voltage on the measurement output.

9. The current measurement circuit of claim 7 wherein the controller includes a hysteresis for preventing oscillations of a comparator output.

10. A load driver comprising:

the current measurement circuit of claim 1.

11. A current protection device comprising:

the current measurement circuit of claim 1.

12. A method of controlling the current measurement circuit of claim 1, the method comprising:

identifying characteristics exceeding a threshold, wherein the threshold is selected to be indicative of a current amplitude below a saturation amplitude associated with the operational amplifier; and controlling the switch to select a current path for reducing the gain across the operational amplifier.

* * * * *